United States Patent

[11] 3,574,926

[72] Inventors Paulette Le Men
158 Blvd. Jean Mermoz, Chevilly-Larue;
Maurice J. Menoret, 12 Avenue de Derdun,
Chatillon-Sous-Bagneux; Pierre Y.
Conruyt, Allee Claude Debussy, L'Hay-Les-
Roses, France

[21] Appl. No. 776,513
[22] Filed Nov. 18, 1968
[45] Patented Apr. 13, 1971
[32] Priority Nov. 29, 1967
[33] France
[31] 130,245

[54] PROCESS FOR SERIES PRODUCTION OF AN ELECTRIC RESISTANCE FOR A HYBRID MINIATURISED CIRCUIT AND THE RESISTANCE THUS OBTAINED
3 Claims, 5 Drawing Figs.

[52] U.S. Cl. .......... 29/583, 29/621, 29/591
[51] Int. Cl. .......... B01j 17/00, H01l 7/66
[50] Field of Search .......... 29/583, 591, 620, 621

[56] References Cited
UNITED STATES PATENTS

| | | | |
|---|---|---|---|
| 3,078,559 | 4/1959 | Thomas | 29/583 |
| 3,284,878 | 11/1966 | Best | 29/620 |
| 3,449,828 | 6/1969 | Solbert et al. | 29/620 |
| 3,486,221 | 12/1969 | Robinson | 29/620 |

*Primary Examiner*—John F. Campbell
*Assistant Examiner*—W. Tupman
*Attorney*—Abraham A. Saffitz

ABSTRACT: A process for the manufacturing of an electric resistance for a hybrid miniaturized circuit from a wafer of p-type silicon or germanium, consisting in preparing said wafer with dimensions exceeding those corresponding to the required resistance value; diamond cutting said wafer into smaller ones, preparing for each smaller wafer two connections in the form of gilded metal strips, welding each smaller wafer to its two connections at a temperature above the gold-semiconductor eutectic formation point, and adjusting said smaller wafers to said required resistance value by removing material therefrom by means of an abrasive powder stream.

INVENTORS:
Paulette LE MEN,
Maurice J. MENORET,
Pierre Y. CONRUYT

By Abraham A. Saffitz
ATTORNEY

INVENTORS:

Paulette LE MEN,
Maurice J. MENORET,
Pierre Y. CONRUYT

By Abraham A. Saffitz
ATTORNEY

PROCESS FOR SERIES PRODUCTION OF AN ELECTRIC RESISTANCE FOR A HYBRID MINIATURISED CIRCUIT AND THE RESISTANCE THUS OBTAINED

The invention relates to a process for series production of an electric resistance for a hybrid miniaturized circuit—i.e., a miniaturized circuit comprising fitted components—and to the resistance thus obtained.

It is known to devise electric resistances on miniature supports, for instance, of alumina by vacuum evaporation of thin layers a few tenths of microns thick of metals such as nickel, chromium, tantalum, etc., but the layers are so thin that inductive couplings which are undesirable in rapid-response logic circuits occur. Another known procedure is to use serigraphy, in layers of the order of a few tenths of microns thick, of metal-based pastes or inks; unfortunately, resistances of the latter kind are relatively costly.

It is also known to make electric resistances from semiconductor substances such as silicon and germanium, but the use of such resistances in rapid-response logic circuits has long been hampered by disadvantages of the constituent substances, such as the inconstancy of resistivity within a single monocrystal and the variation of such resistivity in dependence upon temperature. It is considered that these disadvantages can be substantially eliminated nowadays.

A process for manufacturing semiconductor electric resistances which uses the conventional diffusion technique is known but is delicate to use, since consideration must be given to the shape of the region where the doping substances are concentrated at the time when the same diffuse into the body of semiconductor material, since the body of the required resistance is formed by this diffusion region. Connections must be fixed to the surface of such region by known processes, with the possible result of alterations in the ohmic value of the resistance.

The invention relates mainly to a process for manufacturing an electric resistance of the kind set forth at the beginning hereof but mainly comprising a body of semiconductor material, the process according to the invention being free from the disadvantages mentioned and having other advantages which will be mentioned hereinafter.

The invention also relates to the electric resistance obtained by such process.

According to the invention, therefore, a process for series manufacturing such a resistance comprises, starting from a wafer of a p-type semiconductor substance, such as silicon or germanium which has a given resistivity and is homogeneous and temperature-stable to close tolerances and which is of given thickness, performing the following steps: *a.* overcalculate the dimensions to be given to each elementary wafer which will subsequently form a resistance member, to obtain the required ohmic value; *b.* diamond-cut such wafer into elementary wafers having such dimensions; *c.* prepare for each elementary wafer two connections in the form of pieces of thin strip made of a substance such as nickel, Kovar, Dilver, etc., gilded by metallization; *d.* weld the elementary wafers, each disposed as a bridge, to its two connections by pressure and in an oven at a temperature above the gold-semiconductor eutectic formation point; and *e.* adjust under the control of an ohmmeter the dimensions of each elementary wafer by material removal using an abrasive powder stream until the required ohmic value is achieved to an acceptable tolerance.

The process according to the invention has inter alia the following advantages:

The quality of the end products is comparable to the quality of resistances produced by serigraphy, inter alia the lack of appreciable capacitance and inductance. The resistances according to the invention can therefore be used in rapid-response switching logic circuits.

Only very simple tooling is required for the direct cutting of resistance members, which is a relatively simple and rapid job; similar considerations apply to the welding of the connections;

The circuits used can be of the most ordinary kind—i.e., of the kind produced by photogravure on epoxy resin supports.

Consequently, hybrid miniature circuits comprising resistances according to the invention are considerably cheaper than the prior art products.

The invention will be better understood from the following detailed description of an embodiment of the process, reference being made to the accompanying drawings wherein.

Figure 1:
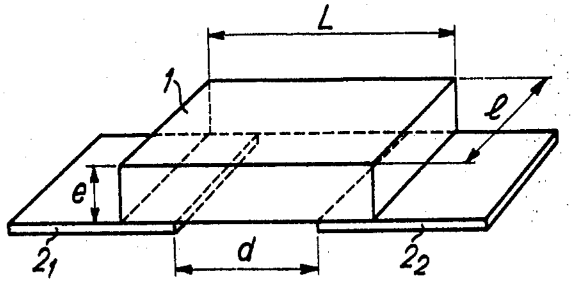
FIG. 1 is a perspective view of a resistance according to the invention.

FIG. 1 shows a resistance according to the invention comprising a parallelepipedic body 1, which is made of a semiconductor substance, such as doped germanium or silicon, as will be seen hereinafter, and connections $\mathbf{2}_1$, $\mathbf{2}_2$ in the form of two pieces of flexible metal strip, e.g. of nickel or one of the nickel called KOVAR (an alloy of cobalt, iron, and nickel which has a thermal coefficient of expansion nearly the same as a range of glass materials used in vacuum technique and widely used in glass-to-metal seals for components such as valves and transistors).

This resistance is adapted to be fitted to a printed board having on its surface printed connections (and possibly printed areas).

It is a simple matter to predetermine the dimensions of such a resistance. If $d$ denotes the distance between the ends of the two connections $\mathbf{2}_1$, $\mathbf{2}_2$, which are disposed opposite one another, $l$ denotes the width and $e$, denotes the thickness of the body 1 and $\rho$ denotes the resistivity of the material used for the body 1, it can be assumed in a first approximation that the ohmic value of the finished resistance is expressed by the classical equation;:

$$R=\rho\frac{d}{el} \qquad (1)$$

Since the position allotted to the resistance on the wafer is already determined, $d$ and $l$ are data as $R$, so that:

$$\frac{e}{\rho}=\frac{d}{lR}$$

If $e$ is expressed in microns and $\rho$ in ohm-centimeters, then:

$$\frac{e}{\rho}=\frac{d}{lR}\cdot 10^4$$

To give some idea of magnitude, it can be assumed that $d$+$l$, so that:

$$e\cong\frac{\rho}{R}\cdot 10^4 \qquad (2)$$

This relation shows that if e.g. silicon, which has a resistivity of from 1.3 to 3 ohm-centimeters is used, a 100-ohm resistance has a thickness of from 130 to 300 microns.

The length L required for the body 1 is determined so that there is an adequate bearing surface of the body 1 on each electrode $\mathbf{2}_1$, $\mathbf{2}_2$. It has been found that, in the case of electrodes in the form of 1 mm. wide metal strip, the quantity (L-$d$) can be 1 mm.

Welding the connection to the ends of one of the major surfaces of the block 1 elongates the current lines of the current distribution inside the block 1, and so any resistance according to the invention must be so cut initially that its width and thickness are slightly greater than the calculated values and are fine-adjusted subsequently with the aid of an ohmmeter.

For instance, the semiconductor substances can be stocked in wafer form to the following "recipe" conditions:

wafer thickness;

resistivity of the material of which they are made;

nature of doping present in wafers; advantageously, the latter are p-type if the connections $2_1$, $2_2$ are to be gold-welded, a type which gives excellent ohmic contacts;

polishing of one surface of the wafers to facilitate wetting by the alloy used for the welding;

±0.2 percent tolerance in homogeneity and temperature stability of the resistivity.

This helps to reduce the process of making the resistances according to the invention to just the following steps:

Cutting the resistance bodies;

Preparation of connections;

Welding the connections to the resistance body.

Figure 2:
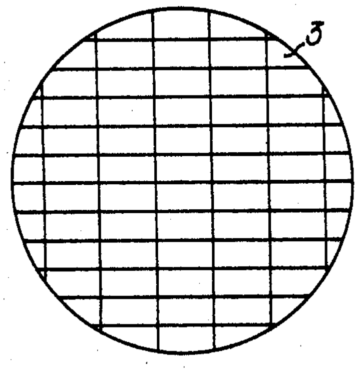
FIG. 2 is a plan view of a semiconductor wafer scored by a diamond in a checkerwork pattern.

The starting material is a wafer 3 (FIG. 2) manufactured to meet the conditions just set forth (thickness, resistivity, etc.). It is stuck by wax to the slide of a carriage which can move in either of two rectangular directions and which can change from one direction to the other. A diamond point is brought into contact with the exposed surface of the wafer and the carriage moves so that the point produces a checkwork scoring. The plate is unstuck from the carriage by heating and placed in a trichloroethylene bath with ultrasonic agitation, so that all traces of wax are removed and the resistance bodies are separated from one another.

Another starting material is a metal strip, for instance, 1 mm wide and 30 microns thick, which has been gilded by a known electrolytic process. The strip is cut into pieces, e.g. 4 mm long, which will subsequently form connections. These connections are placed in pairs in sockets in a graphite crucible having accurately trued flat bases, and a resistance member is then placed on each pair of connections, the whole being immobilized by pressure after the spacing between the connections has been checked by means of an ocular micrometer. The crucible is placed in an oven heated to a temperature of 550° C., a temperature very much above the temperature at which the gold-semiconductor eutectic alloy forms.

Once the resistances have completely cooled, their ohmic values are measured on DC and their dimensions are adjusted by removal of material by means of a very fine stream of abrasive powder, such as alumina.

PRACTICAL EXAMPLE

A NOR-gate logic circuit comprises (see FIG. 3), in an embodiment disclosed by French Pat. Ser. No. 1,534,818 of Jun. 19, 1967 in the names of Conruyt and Serrand for a "Rapid-response logic gate:" *a.* three input networks each comprising an NPN transistor 11, 12, 13 having its base connected to a respective gate input $\mathbf{10}_1$, $\mathbf{10}_2$, $\mathbf{10}_3$. These transistors have identical electrical characteristics and are connected in parallel to one another, their emitters being earthed through a common resistance 16 and their collectors being connected to the positive terminal $\mathbf{10}_5$ of a DC supply via a common point 18 and a common resistance 15; *b.* regenerative output stage embodied by a single NPN transistor 14 which has identical electrical characteristics to the other transistors and which has its base connected to the collectors of the input transistors, its collector being connected to the positive terminal $\mathbf{10}_5$ and its emitter being connected to earth through a resistance 17 which forms the gate output $\mathbf{10}_4$.

Figure 3:
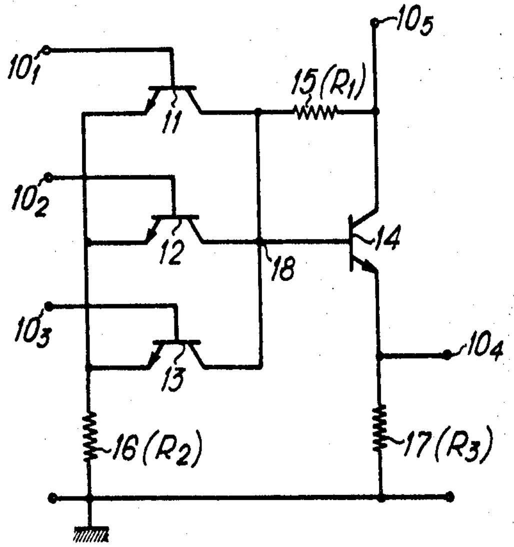
FIGS. 3—5 are diagrams showing exemplary uses of resistances according to the invention.
Figure 4:
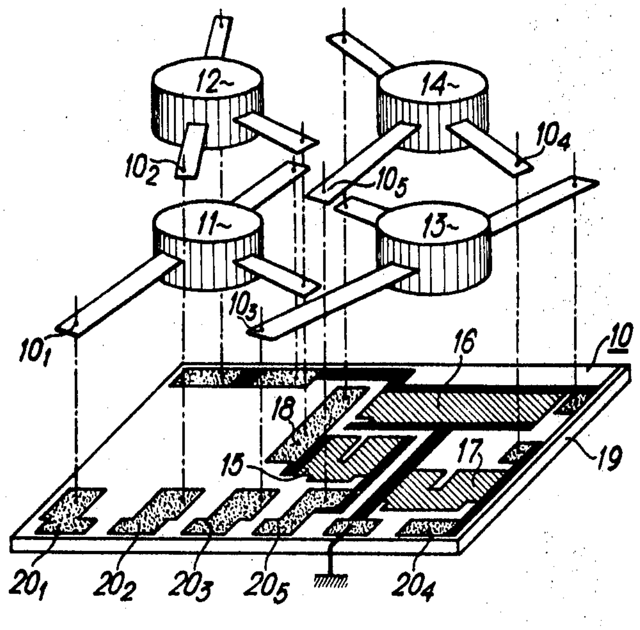

FIG. 4 shows one possible embodiment of the NOR-gate circuit diagrammatically shown in FIG. 3, in the case in which resistances formed by a metal deposited in thin layers, as a rule by serigraphy, are used. A ceramic wafer 19 is the support for a printed microengraved circuit. The transistors 11, 12 are positioned one above another, and the transistors 13, 14 are positioned one above another. These two stacks are retained by the external connections of the transistor electrodes which are welded to metal zones on the wafer 19. Of such zones, the zones $\mathbf{20}_1$ to $\mathbf{20}_5$ correspond to the terminals $\mathbf{10}_1$ to $\mathbf{10}_5$ having the same respective indexes in the diagram of FIG. 3. The zones 15—17 are thin-layer resistances formed on the wafer by serigraphy.

In one construction by the Applicants, the wafer 19 has the following dimensions in millimeters—16×12.7×0.5. After welding the thickness of the wafer increased to 3.6 mm.

Figure 5:
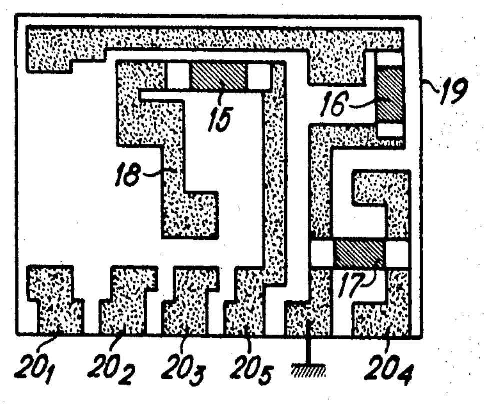

FIG. 5 shows another embodiment of the wafer 19 using resistances according to the invention of semiconductor materials. The only basic difference between the wafer 19 of FIG. 5 and the wafer of FIG. 4 is that in FIG. 5 the microengraved circuit is slightly modified so that resistances 15—17 according to the invention can be welded to it. Wafer dimensions are exactly as in FIG. 4.

The dimensions of the resistance members, tolerances and the temperature coefficients of the resulting resistances are given in the following table:

| | Resistance No. | | |
|---|---|---|---|
| | 15 | 16 | 17 |
| Ohmic value | 100 | 39 | 150 |
| Semiconductor nature | Si | Si | Si |
| Resistivity $\rho$(Ω·cm.) | 2 | 2 | 2 |
| Resistance body dimensions: | | | |
| $e$ (microns) | 250 | 250 | 250 |
| $d$ (mm.) | 1 | 0.5 | 1 |
| $l$ (mm.) | 1 | 1.2 | 0.7 |
| L (mm.) | 2 | 2 | 2 |
| Accuracy $\frac{\Delta R}{R}$ percent | 5 | 5 | 5 |
| Temperature coefficient $\frac{1}{R}\frac{\Delta R}{\Delta T}$ | $10^{-3}$ | $10^{-3}$ | $10^{-3}$ |

in which the dimensions of the resistance bodies and the tolerances refer to the values obtained before adjustment by the abrasive stream.

We claim:

1. A process for the manufacturing of an electric resistance of a required ohmic value for a hybrid miniaturized circuit from a wafer of a p-type semiconductor material of the group consisting of silicon and germanium, said material having a given resistivity and a given thickness and being homogeneous and temperature-stable said process comprising the steps of:

a. giving said wafer initial dimensions exceeding the final dimensions corresponding to said required ohmic value for said resistance;
b. diamond-cutting said wafer into smaller wafers having said final dimensions;
c. preparing for each of said small wafers two connections in the form of pieces of thin metal strips gilded by metallization;
d. welding said smaller wafers each disposed as a bridge to its two connections in an oven at a temperature above the gold-semiconductor eutectic formation point; and
e. adjusting to said required ohmic value the dimensions of each of said smaller wafers by removing material therefrom by means of an abrasive powder stream.

2. A process as claimed in claim 1, in which said metal strips are made of nickel.

3. A process as claimed in claim 1, in which said metal strips are made of a nickel alloy.